(12) United States Patent
Sheppard

(10) Patent No.: US 7,050,345 B1
(45) Date of Patent: May 23, 2006

(54) MEMORY DEVICE AND METHOD WITH IMPROVED POWER AND NOISE CHARACTERISTICS

(76) Inventor: Douglas P. Sheppard, 2204 Shadow Creek, Southlake, TX (US) 76092

( * ) Notice: Subject to any disclaimer, the term of this patent is extended or adjusted under 35 U.S.C. 154(b) by 0 days.

(21) Appl. No.: 10/902,617

(22) Filed: Jul. 29, 2004

(51) Int. Cl.
*G11C 7/02* (2006.01)
(52) U.S. Cl. ...................... 365/206; 365/102
(58) Field of Classification Search .................. 365/206
See application file for complete search history.

(56) References Cited

U.S. PATENT DOCUMENTS

| | | | | |
|---|---|---|---|---|
| 4,982,368 A | * | 1/1991 | Arimoto | 365/206 |
| 5,555,203 A | * | 9/1996 | Shiratake et al. | 365/51 |
| 6,002,625 A | * | 12/1999 | Ahn | 365/206 |
| 6,097,620 A | * | 8/2000 | Naritake | 365/63 |
| 6,579,781 B1 | * | 6/2003 | Hamilton et al. | 257/E21.634 |

* cited by examiner

*Primary Examiner*—Thong Q. Le
(74) *Attorney, Agent, or Firm*—Dan Brown Law Office; Daniel R. Brown

(57) ABSTRACT

A memory device and method with reduced power consumption and improved noise performance. An illustrative embodiment provides a random access memory with an array of plural memory bit cells, having bit-latches coupled between bit-true pass-gates and bit-compliment pass-gates are organized as plural columns and rows. There are plural bit lines pairs aligned with the plural columns, each of the bit line pairs including a bit-true and a bit-compliment bit line. The bit cell pass-gates are electrically coupled to a bit-true and a bit-compliment line pair along each particular column. Plural word lines are aligned with the plural rows, each of the rows having an integer number, greater than one, of word lines aligned therewith. Each one of the integer numbers of word lines is electrically coupled to a fraction of the bit cells in its aligned row. The bit cell to word line coupling is arranged so that no two bit cells within each of the fractions of the plural bit cells are positioned adjacent to one another within the array.

11 Claims, 10 Drawing Sheets

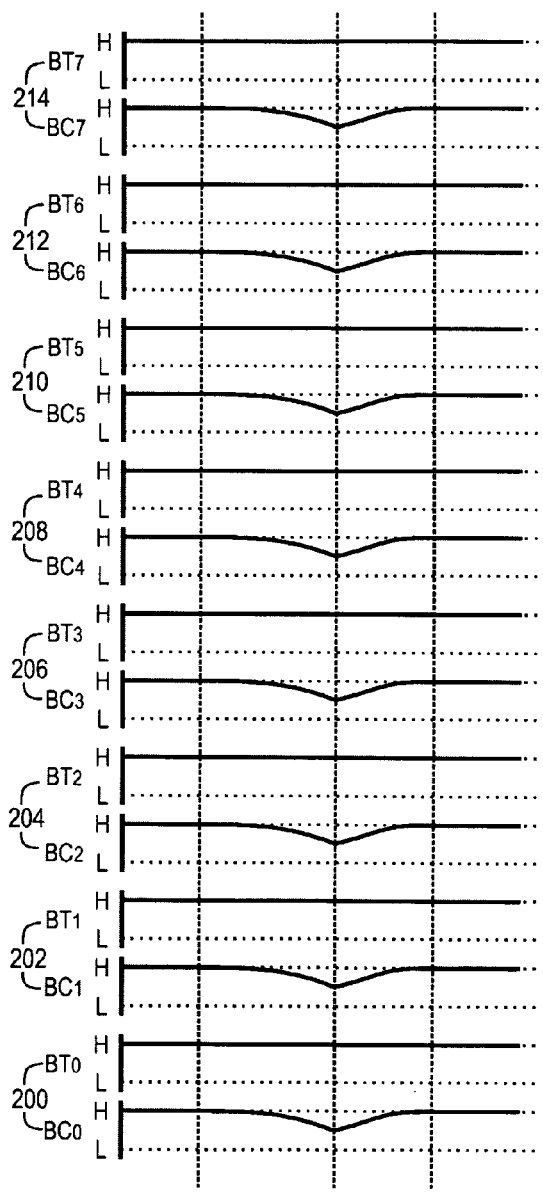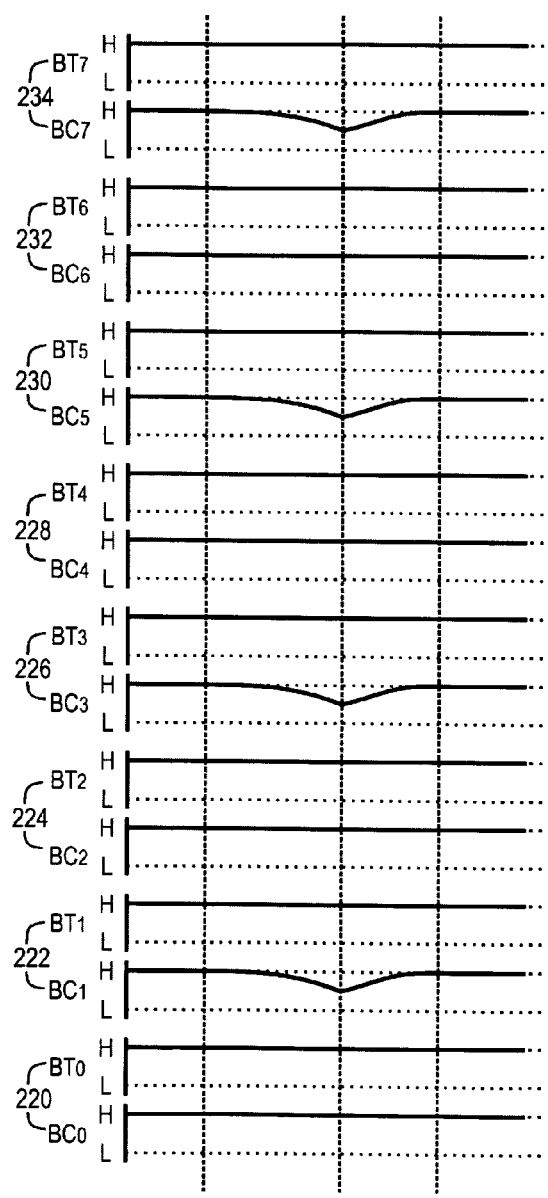
Fig. 11
PRIOR ART
Fig. 12

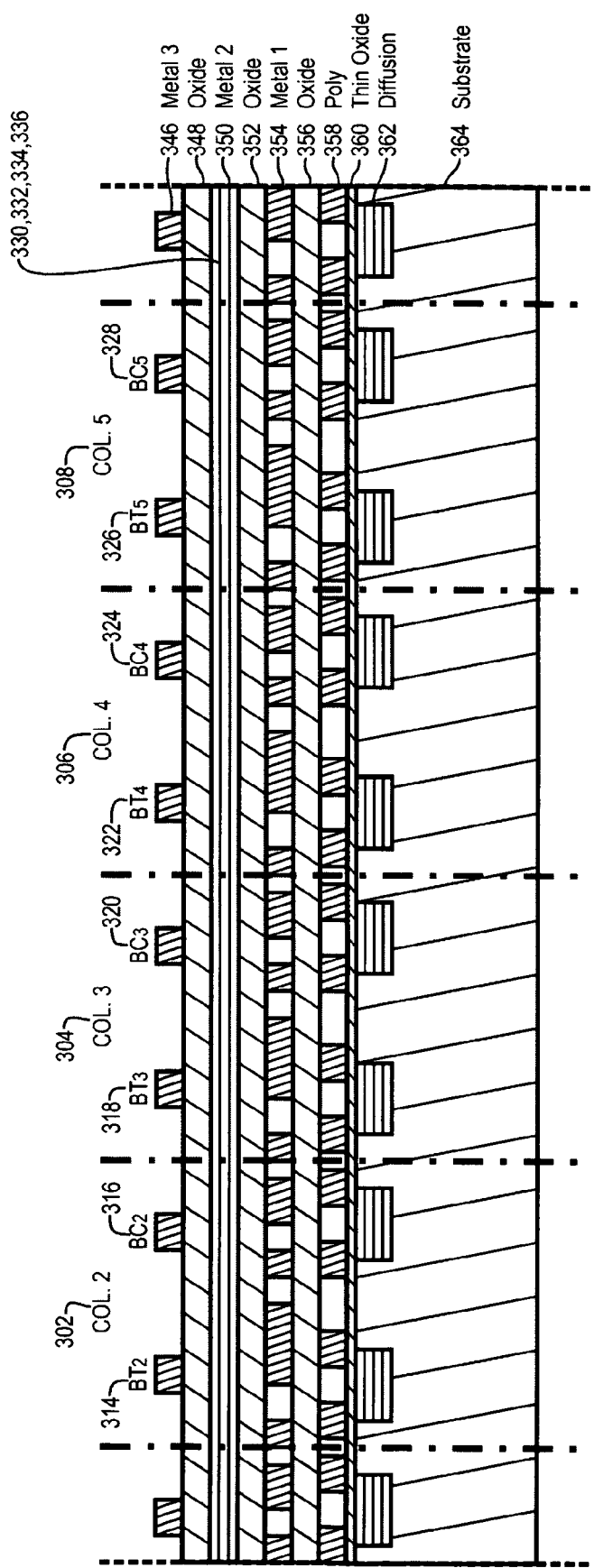

MEMORY DEVICE AND METHOD WITH IMPROVED POWER AND NOISE CHARACTERISTICS

BACKGROUND OF THE INVENTION

1. Field of the Invention

The present invention relates to memories. More specifically, the present invention relates to low power, high speed, digital computer memories.

2. Description of the Related Art

Modern computing devices utilize a variety of kinds of memory devices to store and access information. Several memory device technologies are familiar to those skilled in the art and include the general classes of random access memories ("RAM") and read only memories ("ROM"). These classes further comprise static RAM ("SRAM"), dynamic RAM ("DRAM"), programmable ROM ("PROM"), erasable PROM ("EPROM"), electrically erasable PROM ("EEPROM"), as well as FLASH memory, and other memory types known to those skilled in the art. Most memory devices employ an internal architecture in the form of an array memory of bit cells, comprised of plural rows and plural intersecting columns. This architecture is beneficial in allowing random access to the memory, and in minimizing the number of circuit components needed to implement any given memory size. A memory bit cell is placed at each intersecting row and column in the array. Typically, a particular memory bit cell is accessed by activating its row and then reading or writing the state of its column. Memory sizes are defined by the row and column architecture. For example, a 1024 row by 1024 column memory array defines a memory device having one megabit of memory cells. The memory bit cells are often times arranged into logical groups of memory bits, called words. A convention has emerged in the art, where the array rows are referred to as word lines and the memory columns referred to as bit lines.

Two important, and limiting, characteristics of memory devices are current, or power, consumption and access speed. Power consumption is particularly important in portable battery powered devices. Access speed is important in all devices where designers seek increased performance and functions within computing devices. These two characteristics are fundamentally opposed to one anther in that the faster a memory device is operated, the more power it consumes. Power consumption in memory devices was significantly reduced with the deployment of metal oxide semiconductor transistors ("MOS") and complementary MOS ("CMOS") devices.

A CMOS device advantageously utilizes a complementary pair of insulated gate field effect transistors as a switching circuit such that in a quiescent state, at least one of the two transistors is switched fully off with the gate input signals insulated from the drain-source channels by a metal oxide. As such, no current flows through the insulated gate inputs. Since at least one of the drain-source junctions is pinched off in the quiescent state, no current flows though the drain-source paths either. However, when the device is transitioned from a first "on" state to a second "off" state, the drain-source junctions of each transistor transition through the active region of the transistors, and a small amount of current is therefore consumed. Even in a memory that does not switch active devices at the bit cell junctions, such as a DRAM, a change in voltage within the circuit must act across the capacitive load of the circuit. As is known to those skilled in the art, changing the voltage in a reactive circuit (inductive or capacitive) results in the movement of current in that circuit. Current flow, or power consumption, in capacitive circuit is quantified as the circuit capacitance multiplied by the first derivative of the change in voltage with respect to time. Thus, power consumption in the active state of switching a CMOS device, or any capacitive memory device, can be limited by reducing the circuit capacitance.

Memory devices are most commonly implemented as semiconductor integrated circuits. These circuits are know to those skilled in the art and are comprised of active doped semiconductor circuit devices, such as diodes and transistors, interconnected with metallic traces. Resistive, capacitive, and even inductive components can also be formed using integrated circuit technology. Multiple layers of circuitry are built up upon one another, separated with non-doped insulating layers. In memory devices organized in the aforementioned array structure, the word-rows and bit-columns are formed with long metallic traces that are tapped at each array junction, where a memory bit cell is formed.

The trend in semiconductor memory devices has been toward higher circuit density with higher numbers of bit cells per device, lower operating voltages, and higher access speeds. What this has resulted in, at the physical device level, is smaller device dimensions and closer metallic traces spacing. Modern devices now implement 0.13 micron drain-source channel lengths, and metallic traces about 0.18 microns wide and spaced about 0.16 microns from one another. As will be appreciated by those skilled in the art, the combination of longer trace lengths combined with the close row and column trace spacing results in a limit of operative speed due to the capacitive loads that must be switch with each memory access. In fact, the power consumed by the memory array switching actions is the single greatest current demand in many computing devices. The problem is exacerbated by the reduced circuit dimensions because the reduced current sourcing ability of such small devices, especially taken in combination with the large number of bit cells that are activated with each word row access. In effect, a smaller switch must now control a larger load.

The close spacing of metallic row and column traces with one another and the device ground plane contribute to relatively high capacitive loads and the time constraints that such loads place upon switching and current consumption. They also contribute to significant capacitive coupling between adjacent traces. This coupling is a manifestation of noise that also limits device performance due to signal cross-talk that interferes with the ability of certain sensing circuitry to reliably detect a present output state of switching components within the memory. Thus, there is a need in the art to reduce power consumption, reduce the magnitude of capacitive loads within memory arrays, and reduce the noise coupling within memory devices while reading and writing data thereto.

SUMMARY OF THE INVENTION

The need in the art is addressed by the apparatus and methods of the present invention. A novel memory device is taught. The memory device includes an array of bit cells organized as plural columns and plural rows. There are plural bit lines aligned with the plural columns, with each of the plural bit lines electrically coupled to all of the portion of the plural bit cells that lie along the corresponding column. Also, there are plural word lines aligned with each of the plural rows, and each of the plural word lines is electrically coupled to an alternating fraction of all of that portion of the plural bit cells that lie along the corresponding one of the plural rows. In operation, the plural bit cells do not couple their respective memory states to any of the plural bit lines until activated by one of the plural word lines. The array is arranged such that no two bit cells within each of the fractions of the plural bit cells are positioned adjacent to one another, so that the conductive traces in the memory that form the plural bit lines alternate position corresponding to the alternating coupling of the word line fractions, thereby ensuring that no two adjacent bits lines are simultaneously coupled to bit cells during any given word line activation. This arrangement causes the non-coupled bit lines to act as a neutral conductive elements between activated and accessed bit lines.

In a refinement of the foregoing memory device, the number of the plural word lines aligned with each of the plural rows is an integer number that is greater than one. The integer may be a power of two. Also, the fraction may be the inverse of the integer number. In a specific embodiment, the memory further includes a row decoder that is coupled to the plural word lines and operates to selectively activate the individual word lines that are aligned with each particular row based on the address of a bit cells that are being decoded for access. The individual word lines may be activated for reading data from or writing data to the presently decoded bit cells.

In a further specific embodiment, the bit cells are dynamic memory bit cells and the number of the plural bit lines equals the number of the columns. In another embodiment, the plural bit cells are static memory bit cells and the number of bit lines equals two times the number of the columns. Thus, each of the plural bit cells is electrically coupled to each of a bit-true and a bit-compliment pair of bit lines. In an embodiment where the bit cells are static memory cells, each bit cell includes a bit-latch and at least one pass gate. Then, the pass gate is enabled by asserting the corresponding word line that is electrically coupled thereto.

In an illustrative embodiment of the present invention, a static random access memory with reduced parasitic capacitive coupling for improved noise performance is taught. This memory includes an array of static memory bit cells, each having a bit-latch coupled between a bit-true pass-gate and a bit-compliment pass-gate, that are organized into plural columns and rows. There are plural bit lines pairs aligned with the plural columns, and each of the bit line pairs includes a bit-true and a bit-compliment bit line. Further, the plural bit cell pass-gates are electrically coupled to each of a bit-true and a bit-compliment pair of bit lines within the portion of the static memory bit cells that lie along the corresponding column. Also, there are plural word lines aligned with each of the plural rows, each of the rows has an integer number, greater than one, of word lines aligned therewith. Each one of the integer number of word lines is electrically coupled to a fraction, equal to the inverse of the integer multiple, of all of bit cells that lie along the corresponding row. The plural bit-true and bit-compliment pass gates do not couple their respective bit cell memory states until activated by one of the plural word lines. The array is arranged such that no two bit cells within each of the fractions of the bit cells are positioned adjacent to one another within the array such that the conductive traces in the memory that form the plural bit lines pairs alternate position corresponding to the alternating coupling of the word line fractions. This arrangement ensures that no two adjacent bits lines are simultaneously coupled to bit cells during any given word line activation, thereby causing the non-coupled bit lines to act as a neutral conductive elements between activated and accessed bit lines.

The present invention also teaches a method of accessing a memory that has an array of bit cells organized as plural columns and plural rows. In the memory of this method, each column of bit cells is electrically coupled to at least one first bit line aligned therewith. And, the memory has plural word lines, with an integer number greater than one of the plural word lines aligned with each of the plural rows. Each of the plural word lines is electrically coupled to an alternating fraction of the bit cells that lie along the row of bit cells aligned therewith. The plural bit cells do not couple their respective their respective memory states to any of the plural bit lines until activated by one of the plural word lines. And wherein no two bit cells within each of the fractions of plural bit cells are positioned adjacent to one another, such that the conductive traces in the memory that form the plural bit lines alternate position corresponding to the alternating coupling of the word line fractions, thereby ensuring that no two adjacent bit lines are simultaneously coupled to adjacent bit cells during any given word line activation, thereby causing the non-coupled bit lines to act as neutral conductive elements between activated and accessed bit lines. The method includes the steps of asserting a first word line, thereby enabling the fraction of the bit cells along the row aligned therewith, and accessing at least one of the enabled bit cells through the corresponding electrically coupled bit line.

In a refinement of the method, the integer number is a power of two. The method may include the steps of writing data to the at least a first one of the enabled bit cells or reading data from the at least a first one of the enabled bit cells. In the case where the memory is a static memory, the number of plural bit lines equals two times the number of columns, and each of the plural bit cells is electrically coupled to each of a bit-true and a bit-compliment pair of the plural bit lines. Further, each may include a bit-latch and at least one pass gate, then the asserting step further includes the step of enabling the pass gates of the fraction of bit cells along the row aligned therewith.

BRIEF DESCRIPTION OF THE DRAWINGS

FIG. 11 is a signal-timing diagram for a memory device according to the prior art.

FIG. 12 is a signal-timing diagram for a memory device according to an illustrative embodiment of the present invention.

FIG. 14 is a section view drawing of a portion of a memory array according to an illustrative embodiment of the present invention.

DESCRIPTION OF THE INVENTION

Figure 1:
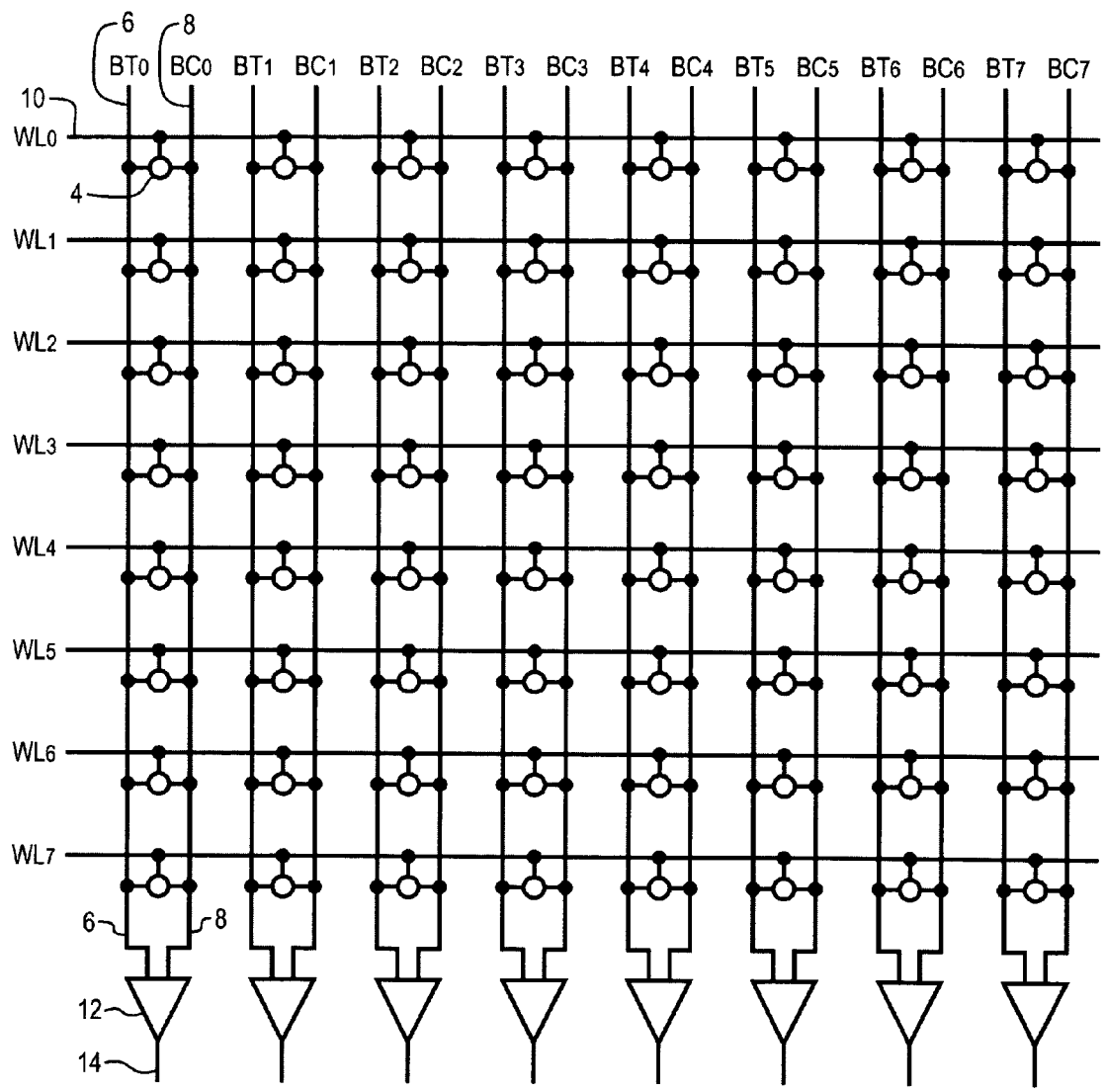
FIG. 1 is a diagram of a prior art memory array.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention teaches a memory apparatus and method that provides two principal benefits in memory systems. First, the present invention enables a memory device of given size to operate with reduced power consumption. Second, is the elimination of a significant noise problem that exists in prior art memory array designs. The reduction in noise can result in improved chip yield in the manufacturing environment, and increased access speed of the memory device in the operational environment. Memory devices that can benefit from the teachings of the present invention are useable in a wide variety of applications and systems. Among these are most microprocessors, microcontrollers, digital signal processors, and application specific integrated circuits ("ASIC"). Such devices and systems are deployed in a huge range of products including wireless telephones, computing devices, dedicated control devices, toys and games, diagnostic and test equipment, consumer products, medical products, industrial products, and so on. The reduced power consumption benefit of the present invention is particularly beneficial in battery powered devices, as this extends useful battery life. However, considering the noise improvement aspects of the present invention, the benefits are useful in all memory applications, regardless of power supply considerations. The teachings of the present invention are applicable to all current memory technologies, including SRAM, DRAM, EPROM, EEPROM, CMOS, register files, dual and multi port memory devices, and all other technologies.

While modern memory devices consume remarkably low levels of current in the quiescent state, current consumption is significant during memory access cycles, including reading and writing memory cells. This mode of power consumption is known as dynamic power consumption by those skilled in the art. Dynamic power current draw is a function of the device capacitance, and the current drawn is expressed as $I=C(dv/dt)$. When memory cells are being cycled near their highest speed capability, and this is how many memory devices are operated, there is considerable amount dynamic power consumed. The dynamic power can be reduced if the memory capacitance can be reduced. Device capacitance includes the capacitance created by the presence of metallic circuit traces within the device and the diffusion capacitance present at the nodes of the various active devices within the memory device. Those skilled in the art will appreciate that in modern memory circuits, the metallic circuit trace capacitance is a major contributor to the overall device capacitance, and therefore has significant implication respecting noise coupling. In essence, switching signals within the memory device capacitively couple signals between metallic traces. The coupled signals are noise that decreases the effectiveness of various signal level sensing circuits employed to determine device logical states.

Reference is directed to FIG. 1, which is a diagram of a prior art SRAM memory cell array 2. While the present invention is applicable to all memory types and memory arrays, the illustrative embodiment is drawn with respect to a static random access memory array because this type of memory involves a more complex circuit topology and thus illustrates a greater range of the inventive teachings. The memory array 2 illustrated in FIG. 1 is an eight bit cell 4 by eight bit cell 4 array. While this size memory array 2 is not practical in most modern application due to its limited sixty-four bit storage capacity, those skilled in the art will readily appreciate that the array 2 is readily scalable to any size array that may by required by a memory device designer. For example, the array could readily be scaled to a 1024 by 1024 bit cell array, which defines a one megabit memory array. The static memory array 2 comprises eight word lines 10 that are identified as "$WL_0$" through "$WL_7$" in FIG. 2. Each word line 10 is electrically coupled to all of the bit cells 4 along the row of bit cells 4 in the array 2 that are aligned with each word line 10. Thus, the array 2 comprises eight rows, each aligned with a single word line 10. Note that the reference numerals indicate plural like elements in the drawing collectively. For example, reference numeral 4 indicates all of the bit cells in the figure, and not just the single bit cell adjacent to the reference numeral in the figure. This convention is utilized in the Figures and serves to prevent the clutter of repetitious reference numeral usage.

The array 2 is further organized into eight columns of bit cells 4. Each column is aligned with two bit lines, a bit-true bit line 6 and a bit-compliment bit line 8. The bit-true bit lines 6 are identified as "$BT_0$" through "$BT_7$" in FIG. 2. Similarly, the bit-compliment bit lines 8 are identified as "$BC_0$" through "$BC_7$" in FIG. 2. Each of the bit lines are electrically coupled to all of the bit cells 4 along the column of bit cells 4 in the array 2 that are aligned with each bit line. Thus, each bit cell 4 is addressed as the intersection of a single word line 10 and a pair of bit lines 6, 8. A static memory device employs a pair of bit lines 6, 8 because the state of each bit cell 4 is determined by sensing the differential voltage between the two corresponding bit lines. This sensing function is accomplished with a sense amplifier 12 coupled to each pair of bit line 6, 8. The sense amplifiers 12 are differential amplifiers that sense a differential voltage between the two associated bit lines 6, 8. The output 14 of each sense amplifier 12 is indicative of the present state of the bit cell that is accessed by asserting one particular word line 10 in the array 2. The circuit functions of this access operation will be more fully described below.

Figure 2:
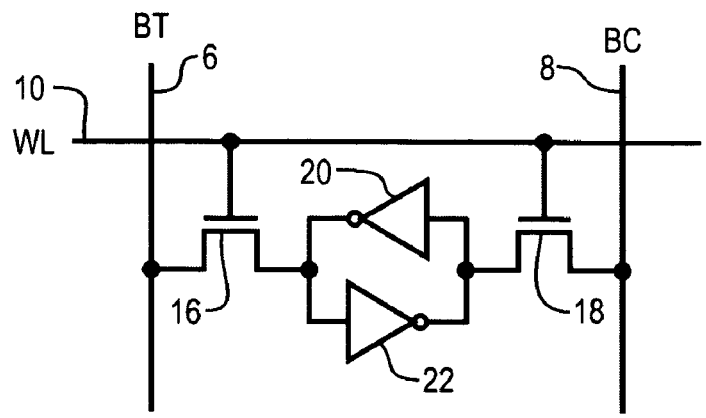
FIG. 2 is a schematic diagram of a prior art memory cell.

Reference is directed to FIG. 2, which is a schematic diagram of a prior art memory cell 4. The memory cell 4 is typical of a static random access memory cell known to those skilled in the art. A pair of inverters 20 and 22 are reverse coupled to form a data latch sub-circuit. This sub-circuit is powered between the power supply voltage and ground reference of the memory device (not shown). The input/output nodes of the data latch sub-circuit are coupled through pass gates 16 and 18, which are MOSFET transistors. The gate terminal of pass gates 16, 18 are coupled to the word line 10 that is aligned with the particular bit cell 4. In the inactive state, the word lines provides a signal that pinches-off the drain-source channel of pass gates 16, 18 such that the data latch is isolated from the bit lines 6, 8 by the high impedance of the pinched-off MOSFETs 16, 18. If the pass gates 16, 18 are P-channel devices, then the pass gates are pinched-off with a logical high level signal. When the word line 10 is asserted, the change of state causes the drain-source channel of each pass gate 16, 18 to enter a low impedance state and this couples the data latch inverters 20, 22 to the bit-true bit line 6 and the bit-compliment bit line 8. Thus, assertion of the word line 10 results in a coupling the memory cell 4 to the corresponding bit lines 6, 8.

Now considering the function of the word line 10 assertion, which couples that bit cell 4 to the bit lines 6, 8, and considering the general arrangement of the memory array shown if FIG. 1, a fundamental problem in the prior art is realized. Each time a word line 10 is asserted, all of the bit cells 4 that are aligned with that row are activated and coupled to the several bit lines. Since each bit line is a long metallic trace, each has a significant degree of capacitance. And since designers continue to shrink the physical dimensions of integrated circuit memory devices, the data latch circuit has limited current sourcing ability due to its small physical size. Thus, the relatively large capacitive load multiplied by the number of bit lines in the array, results in a large current and power consumption, due to the aforementioned I–C(dv/dt) relationship.

Figure 3:
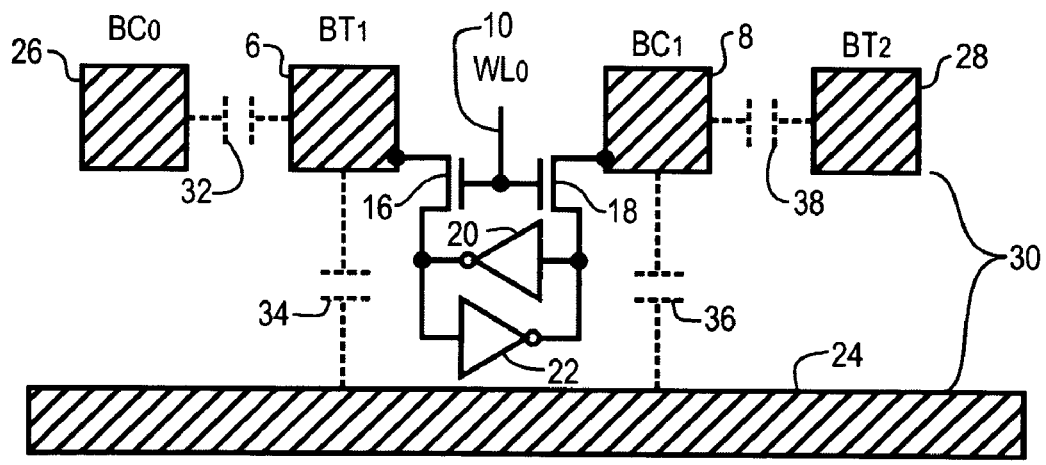
FIG. 3 is a sectional illustration of the bit lines and ground plane of a memory cell in a prior art static memory device.

Reference is directed to FIG. 3, which is a sectional illustration of the bit lines and ground plane arrangement of a prior art memory cell in a static memory device. The integrated circuit has a conductive ground plane 24 at its base. The various circuit components forming the data latch inverters 20, 22, pass gates 16, 18, and word lines 10 are disposed upon the integrated circuit base as various circuit layers, known to those skilled in the art. At some distance 30 above the ground plane 24, the bit-true bit line 6 and bit-compliment bit line 8 for that particular bit cell are shown in section. Because of the physical arrangement of the metallic traces 6, 8 and the ground plane 24, parasitic capacitance 34 and 36 are created. Further, since the integrated circuit is of high density, the adjacent bit lines 26 and 28 are in close proximity to the bit-true 6 and bit compliment 8 bit lines, respectively. This physical arrangement produces parasitic capacitance 32 and 38, respectively. Thus, in addition to the parasitic capacitance 34 and 36, which must be switched and thus consume dynamic power, switching of adjacent bit lines 26 and 28 induce signals onto the bit true 6 and bit-compliment 8 bit lines. The induced signals are noise that reduces the effectiveness of the sense amplifiers (not shown) in detecting the present state of the signals on bit lines 6 and 8.

Figure 4:
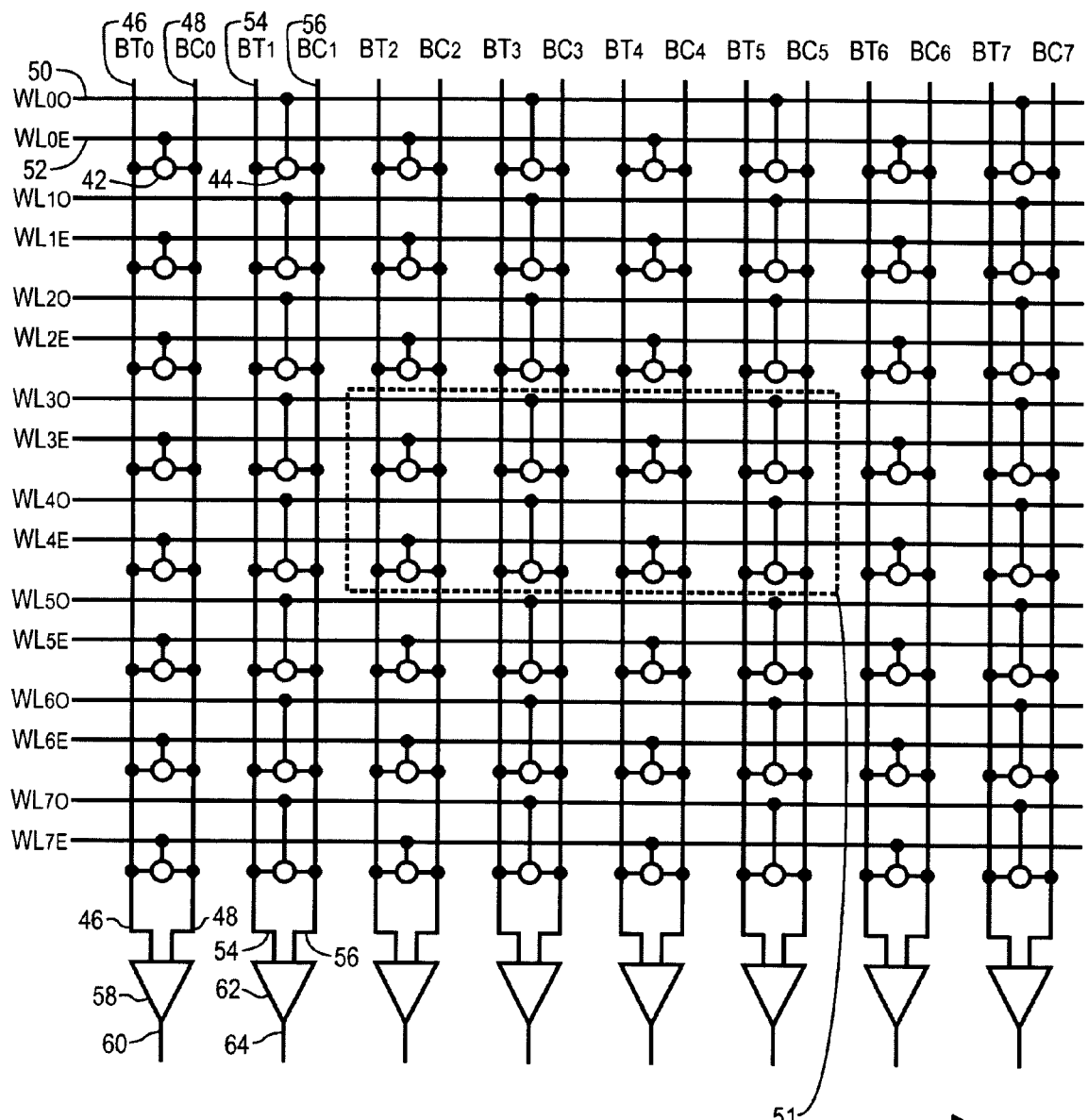
FIG. 4 is a diagram of a memory cell array according to an illustrative embodiment of the present invention.

The present invention greatly improves upon the problems associated with the parasitic capacitance in the prior art by reducing the capacitive load switched with each word line assertion and by isolating adjacent bit lines from coupling noise signals between each other. Reference is directed to FIG. 4, which is a diagram of a memory cell array 40 according to an illustrative embodiment of the present invention. The illustrative embodiment memory array 40 is an eight by eight bit cell array. Those of ordinary skill in the art will appreciate that the array size can be readily scaled to any size memory that is presently employed by memory designers, or that later becomes useful. It is known that memory bit cell arrays are most commonly arranged into rows and columns that are integer numbers, frequently powers of two. Also, that the number of columns in the array is frequently an integer multiple of the system word length. For example, in a system that employs eight bit long data words, the number of rows would be an even multiple of the number eight. In most applications, that integer multiple is two or more.

In the illustrative embodiment in FIG. 4, the conventional arrangement of one word line per row of bit cells is changed to two, or more, word lines per row. In the array 40 of the illustrative embodiment there is an 'odd' word line 50 and an 'even' word line 52 aligned with each row of bit cells. The odd word lines are identified as "$WL_{0O}$" through "$WL_{7O}$", and the even word lines are identified as "$WL_{0E}$" through "$WL_{7E}$". The columns of bit cells are described as 'odd' and 'even' columns according to the subscripted bit line numbers that are used for reference. Specifically, bit-true bit lines on odd columns 54 are identified as "$BT_1$", "$BT_3$", "$BT_5$", and "$BT_7$". Likewise, bit-compliment bit lines on odd columns 56 are identified as "$BC_1$", "$BC_3$", "$BC_5$", and "$BC_7$". Similarly, bit-true bit lines on even columns 46 are identified as "$BT_0$", "$BT_2$", "$BT_4$", and "$BT_6$", and, bit-compliment bit lines on even columns 48 are identified as "$BC_0$", "$BC_2$", "$BC_4$", and "$BC_6$". Each of the bit-true and bit-compliment bit lines for a given column are coupled to a differential sense amplifier that functions to sense the state of the presently accessed bit cell in the column. More particularly, the odd columns bit-true line 46 and bit-compliment line 48 are coupled to sense amp 58 that outputs the bit cell state at 60. Likewise, the even columns bit-true line 54 and bit-compliment line 56 are coupled to sense amp 62 that outputs the bit cell state at 64.

The beneficial reduction of capacitive load, and therefore power consumption, as well as the isolation of capacitively coupled noise, occurs through the selection of which individual bit cells are coupled to each of the plural word lines aligned with each row. The bit cells in the odd columns 42 are electrically coupled to the odd word lines, and the bit cells in the even columns 44 are electrically coupled to the even word lines. All of the bit cells in each column are electrically coupled to the bit-true and bit-compliment bit lines aligned with the row in which they are located. The result if this arrangement in the illustrative embodiment is that each word line assertion now energizes a fraction of the bit cells aligned with its row, and therefore reduces the number of bit lines that must be driven with each word line assertion. This reduces the capacitive load associated with each word line assertion by that same fraction. The fraction of bit cells accessed is equal to the inverse of the number of word lines implemented per row, assuming that each word line drives an equal number of bit cells as the other word lines in the same row. In the illustrative embodiment, where two word lines are used per row, the fraction is one-half. Of course, more than two word lines could be implemented per row. Typically, the number of word lines per row will be a power of two due to the nature of digital memories and addressing schemes, however any integer number of word lines could be implemented under the teachings of the present invention. The greater the number of word lines, the lesser the fraction, and the lower the associated capacitive load becomes.

There are practical limits to the number of word lines that can reasonably be implemented per row. With each additional word line, there must be a metallic trace implemented in the physical device. However, since integrated circuits are implemented with multiple layers of metal and semiconductors, two or four word lines per row can be implemented with virtually no increase in chip size. Even eight word lines per row is reasonable. Future integrated circuit technologies may allow designers to use even greater number of word rows. Memory arrays are typically arranged with an eye toward the word size of the intended application. If is preferable that all bits in a given word address be aligned along a single word row, since this allows the entire word to be decoded in a single word line assertion. This implies that each row should have a minimum number of bit cells equal to the number of bits per word times the number of word lines per row. In the illustrative embodiment, two four-bit words fit in each row of bit cells, with two word lines employed per row. Practically speaking this is not a significant limitation as larger memory devices typically have many times the number bits per word in each word row. Those skilled in the art will appreciate that the word line decoding operation, commonly referred to as the row decoder operation, must operate in conjunction with the multiple word line addressing scheme. While this can result in increased component device count in the row decoder circuitry, this is still a small price to pay, both in terms of chip real estate and current consumption, especially when the benefits of power reduction and noise improvement are considered.

Respecting the benefit of reduced parasitic noise aspect of the present invention, this is accomplished in the illustrative embodiment by alternating which of the individual bit cells are coupled to each word line. Every other bit cell is coupled to each word line, or stated another way, the odd bit cells couple to the odd word lines, and the even bit cells couple to the even word lines. This approach results in a situation where any given accessed bit cell will be surrounded by two adjacent bit cells that are not accessed during the same word line assertion cycle. This allows the non-accessed bit cells' bit lines to decouple any capacitive signal coupling between the alternating accessed bit cells' bit lines. Those skilled in the art are familiar with the technique of decoupling capacitive signals with a neutral conductive element. Of course, this alternating approach works with any number of word lines per row, as long as it is greater than one. In a static RAM, such as in the illustrative embodiment, all of the word and bit lines are pre-charged to a high voltage level (approximately Vcc) between each memory access cycle, and are then transitioned to a high impedance state just before the actual access cycle. During read and write access cycles, the bit lines and word lines, as well as the sense amplifier output lines may be driven toward a low voltage state, depending on the sate of the accessed memory cell. It is the movement of signals that induces the capacitive coupling. This aspect of the illustrative embodiment will be more fully described hereinafter.

Figure 5:
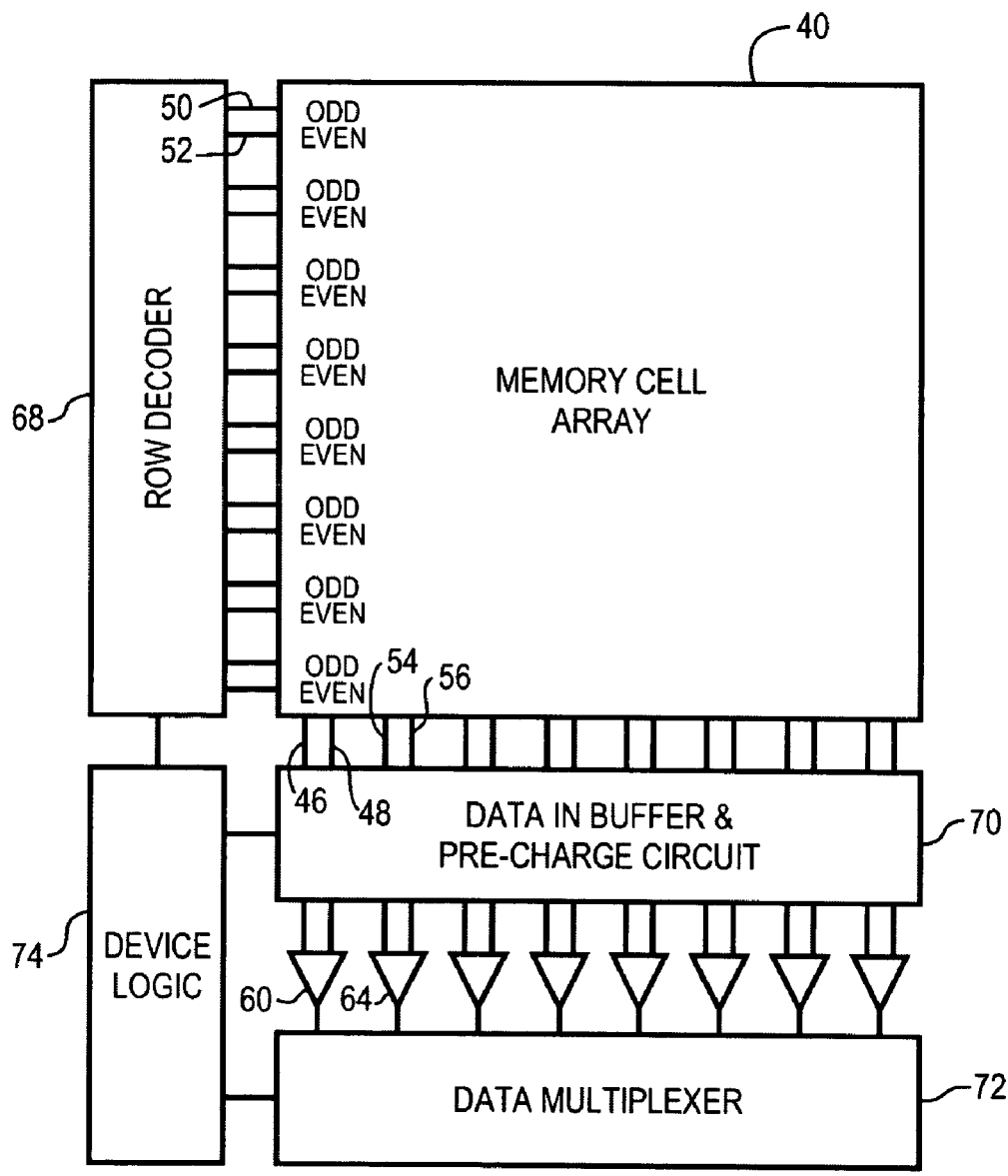
FIG. 5 is a functional block diagram of a memory device according to an illustrative embodiment of the present invention.

The illustrative embodiment has been described at the memory array device level thus far. This basic digital memory building block embodies the present invention, however, placing that element into a memory system adds a perspective to understanding the present invention. Reference is directed to FIG. 5, which is a functional block diagram of a memory device according to an illustrative embodiment of the present invention. The memory cell array 40 discussed with respect to FIG. 4 is coupled in circuit in FIG. 5. In FIG. 5, memory array 40 is driven by a row decoder 68 through the odd word lines 50 and the even word lines 52. The odd bit-true lines 46 and odd bit-compliment lines 48 couple to odd sense amplifiers 60. Similarly, even bit-true lines 54 and even bit-compliment lines 56 couple to even sense amplifiers 60. The bit lines 46, 48, 54, and 56 are also electrically coupled to data input buffers and line pre-charge circuitry 70. Those skilled in the art understand that memory read operations are made by reading the output of the sense amplifiers 60, 64, and that data input buffers 70 are electrically coupled to the bit lines and used to write the memory array 40 bit cells during memory-write operations. The pre-charge circuitry 70 is also known to those skilled in the art, and is used to drive all the bit lines (as well as certain other memory circuits) to a high state prior to each access, so as to increase device speed. The output of the several sense amplifiers 60, 64 are coupled to a data multiplexer, which multiplexes memory words according to the memory designer's specification. Ultimately, the row decoder 68 and data multiplexer 72 couple to other device circuitry 74 that utilizes the memory cell array 40 for storage and retrieval of data according to the needs of the device and specification of the device designers.

Figure 6:
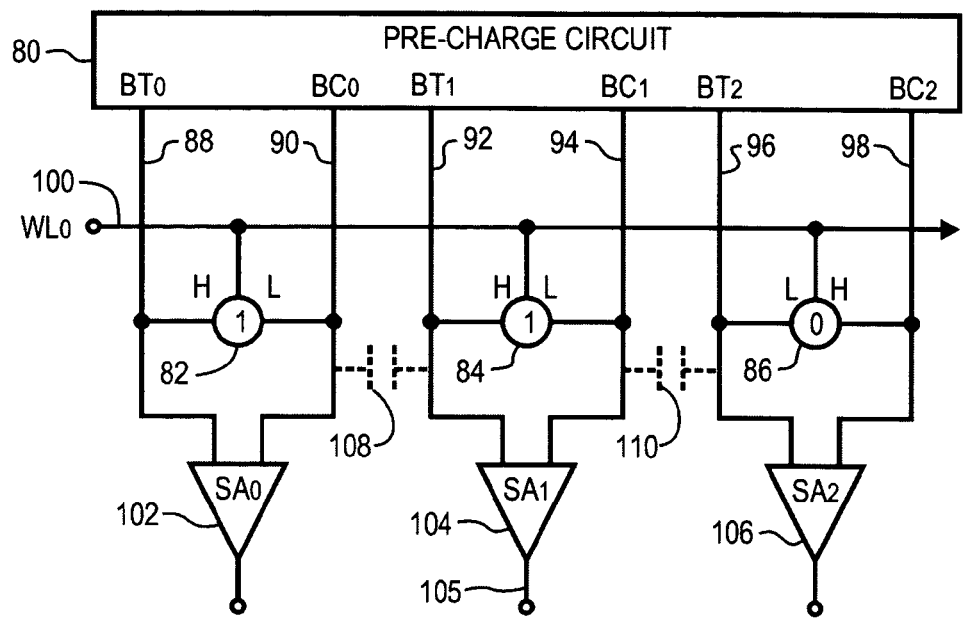
FIG. 6 is a schematic diagram of a portion of a prior art memory device.

Reference is directed to FIG. 6, which is a schematic diagram of a portion of a prior art memory device. As noted herein before, many memory devices employ a pre-charge circuit to improve device speed and performance. FIG. 6 illustrates a small, three-bit, portion of a memory device. The three bit cells 82, 84, and 86 have a logical state of HIGH, HIGH, and LOW, respectively. These states are also known as binary values '1', '1', and '0', respectively. As such, during a read cycle, bit-true bit line 88 will be driven high, bit-compliment bit line 90 will be driven low. Similarly, bit-true bit line 92 will also be driven high, and bit-compliment bit line 94 will be driven low. Since bit cell 86 has a binary '0' stored therein, the opposite is true. Specifically, bit-true bit line 96 will be driven low, and bit-compliment bit line 98 will be driven high. Sense amplifier 102 senses the differential voltage of the bit lines for bit cell 82, sense amplifier 104 senses the differential voltage of the bit lines for bit cell 84, and sense amplifier 106 senses the differential voltage of the bit lines for bit cell 84. Note that the pre-charge circuit 80 drives all of the bit lines to a high state prior to a read cycle, which occurs when the word line 100 is asserted. When the word line 100 is asserted, each of the coupled memory bit cells 82, 84, and 86 are coupled to their associated bit lines and then each drives the corresponding bit lines to the aforementioned logical states. In the case where a logical state is LOW, then the associated bit line is driven from the pre-charged HIGH state toward a LOW state. As voltage along the bit lines change, the inherent capacitive coupling of the adjacent circuit traces comes into play. In particular, bit line 90 and bit line 92 are capacitively coupled by parasitic capacitance 108, and, bit line 94 and bit line 96 are capacitively coupled by parasitic capacitance 110. The effects on device performance caused by the parasitic capacitance are understood through reference to FIG. 7.

Figure 7:
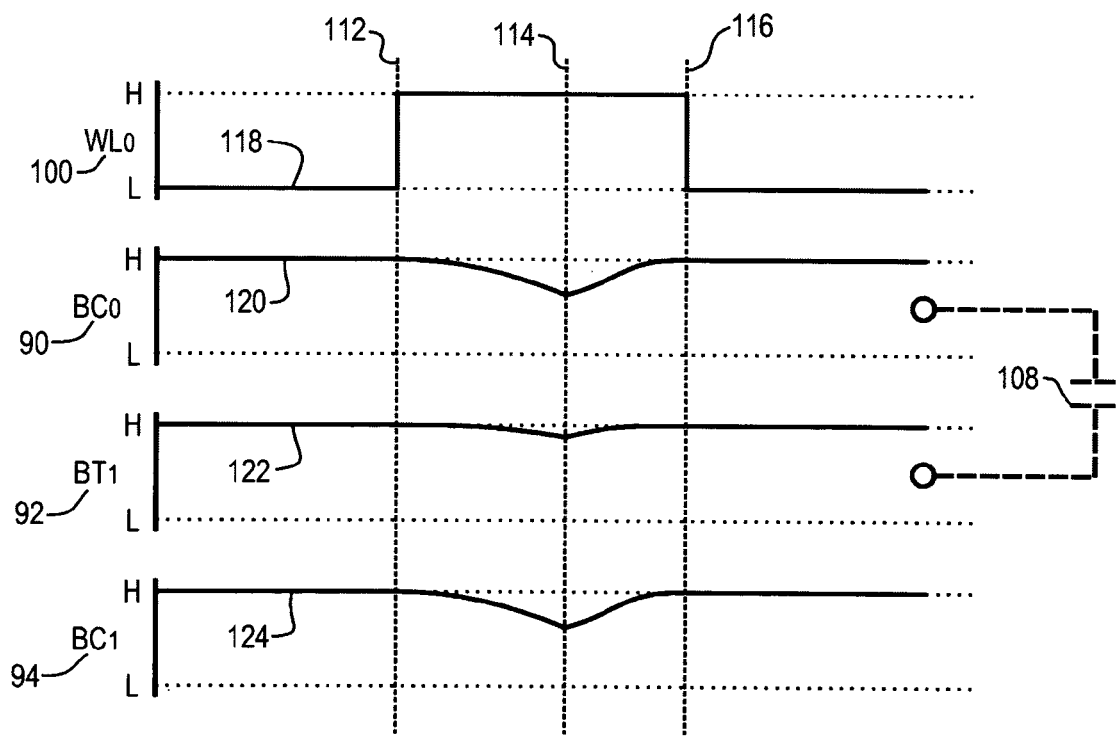
FIG. 7 is a signal-timing diagram for a prior art memory device.

In FIG. 7, a signal-timing diagram for the prior art memory device illustrated in FIG. 6 is shown. The timing diagram is referenced with respect to the word line 100 assertion cycle 118. There are three significant time references, which include the assertion 112 of the word line, the activation 114 of the pre-charge circuit 80 and the de-assertion 116 of the word line 100. The time of activation 114 of the pre-charge circuit is essentially coincident with the reading of the sense amplifier outputs. As the word line 118 is asserted 112, the bit-compliment bit line 90 of bit cell 82 is driven low due to the logical '0' stored therein. The change in voltage of bit-compliment bit line 90 appears in the voltage signal 120 in FIG. 7. Because of the low current sourcing ability of the bit cell 82, and the large capacitive load of the long bit line, the voltage decays rather gradually along signal 120. Note that the adjacent bit-true bit line 92 of bit cell 84 remains in a logical HIGH state and, therefore, should not change. However, the capacitive coupling 108 between these bit lines causes a reduction in the voltage level of bit line 92, as is illustrated in bit-true bit line 92 signal voltage level 122. Also, the bit-compliment bit line 94 of bit cell 84 is driven low due to the logical HIGH state of bit cell 84, as is indicated in voltage signal 124. The differential voltage between bit-true bit line 92 and bit-compliment bit line 94 are sensed by sense amplifier 104, which produces a corresponding output 105 at time 114, when the sense amplifiers are read. It can be appreciated that the capacitively coupled signal 122 on bit-true bit line 92 degrades the voltage differential sensed by sense amplifier 104. After the sense amplifier read time 114, which is also the pre-charge circuit activation time, all of the signal levels 120, 122, and 124 are driven back to the HIGH voltage level.

Figure 8:
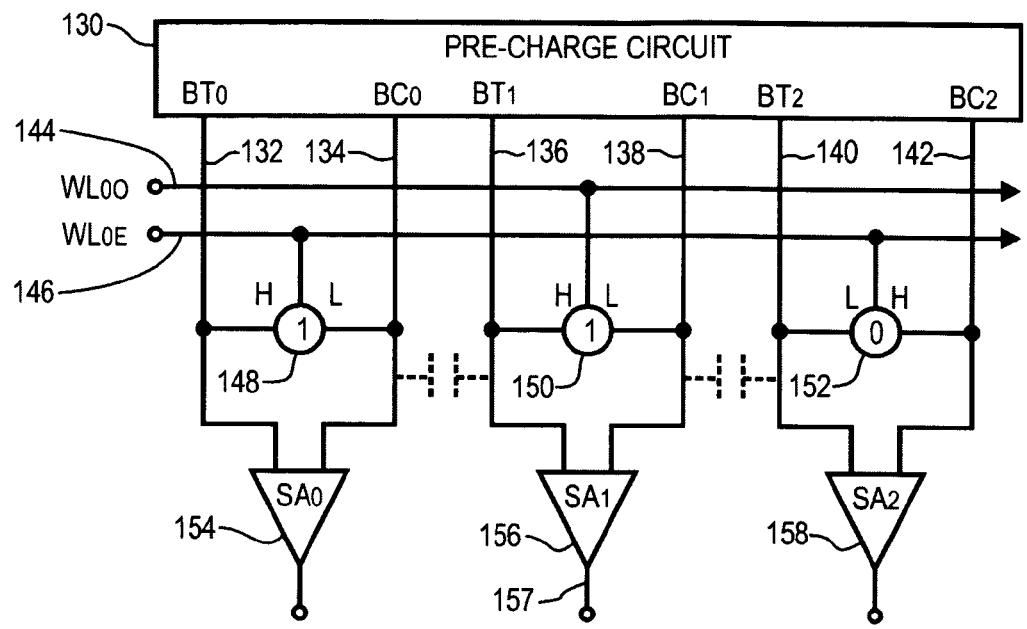
FIG. 8 is a schematic diagram of a portion of a memory device according to an illustrative embodiment of the present invention.
Figure 9:
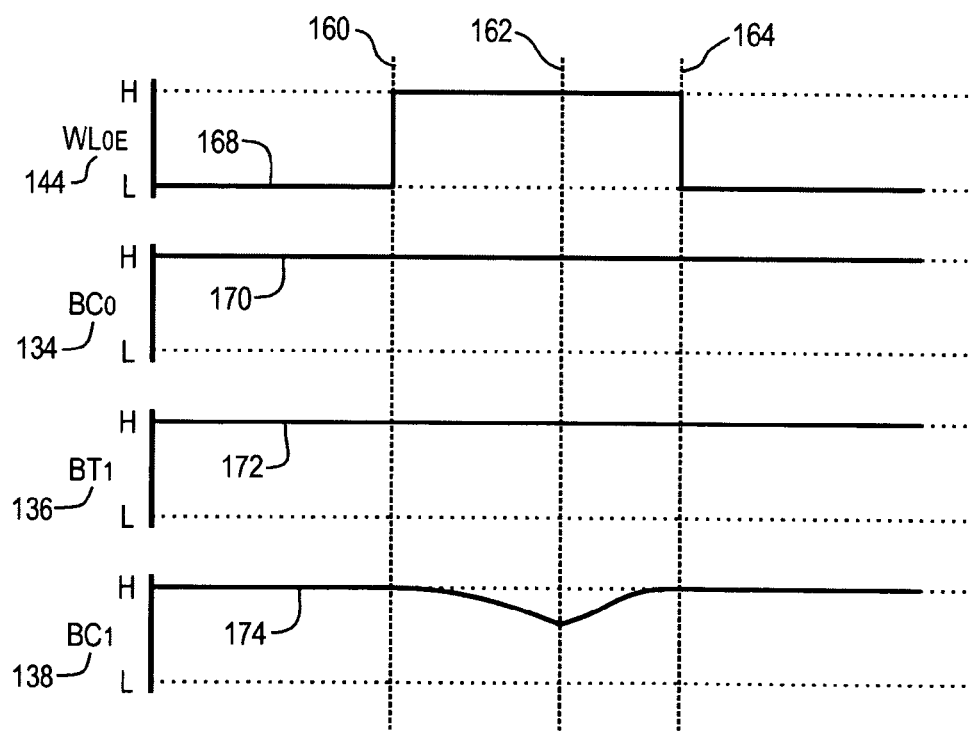
FIG. 9 is a signal-timing diagram for a memory device according to an illustrative embodiment of the present invention.

Reference is now directed to FIG. 8 and FIG. 9, which are a schematic diagram of a portion of a memory device according to an illustrative embodiment of the present invention and its corresponding signal-timing diagram. The small section of memory cells 148, 150, and 152 employ the teachings of the present invention. There are two word lines, an even word line 146 and an odd word line 144. The even bit cells 148 and 152 are coupled to the even word line 146. The odd bit cell 150 is coupled to the odd word line 144. The bit cells 148, 150, and 152 have the binary values '1', '1', and '0' stored therein respectively. Bit cell 148 is coupled to bit-true bit line 132 and bit-compliment bit line 134, which are coupled to sense amplifier 154.

Bit cell 150 is coupled to bit-true bit line 136 and bit-compliment bit line 138, which are coupled to sense amplifier 156. Bit cell 152 is coupled to bit-true bit line 140 and bit-compliment bit line 142, which are coupled to sense amplifier 158. All of the bit lines are coupled to pre-charge circuit 130. In FIG. 9, the odd word line 144 is asserted according to signal 168, which is marked for the time of assertion 160 of the word line, the sense amplifier read and pre-charge circuit activation time 162, and the word line 144 de-assertion time 164. Note that assertion of the odd word line 144 accesses just the odd bit cell 150. Even bit cells 148 and 152 are not accessed. As such, the pre-charged condition that exists on the related bit lines remains during the assertion of the odd word line 144. This fact is evident by reference to the voltage signal 170 diagram of bit-compliment bit line 134 in FIG. 9, which remains at a high level throughout the assertion cycle of the even word line 144. Note that since bit cell 150 is in a logical HIGH state, the read cycle produces a logical HIGH in the bit-true bit line 136, and hence the voltage signal 172 remains high through the cycle as well. Further, since the adjacent bit compliment line 134 does not change, there is no capacitive coupling of noise to bit-true bit line 136. The bit-compliment bit line 138 of bit cell 150 is driven low, as is illustrated by the voltage waveform 174 in FIG. 9. The sense amplifier 156 senses the full differential voltage between bit-true line 136 and bit-compliment line 134, absent the coupling of any signals from the adjacent bit-compliment line 134 and bit-true line 140. Thus, the sense amplifier output 157 is stable prior to the sense amplifier read time 162 by a greater margin.

Figure 10:
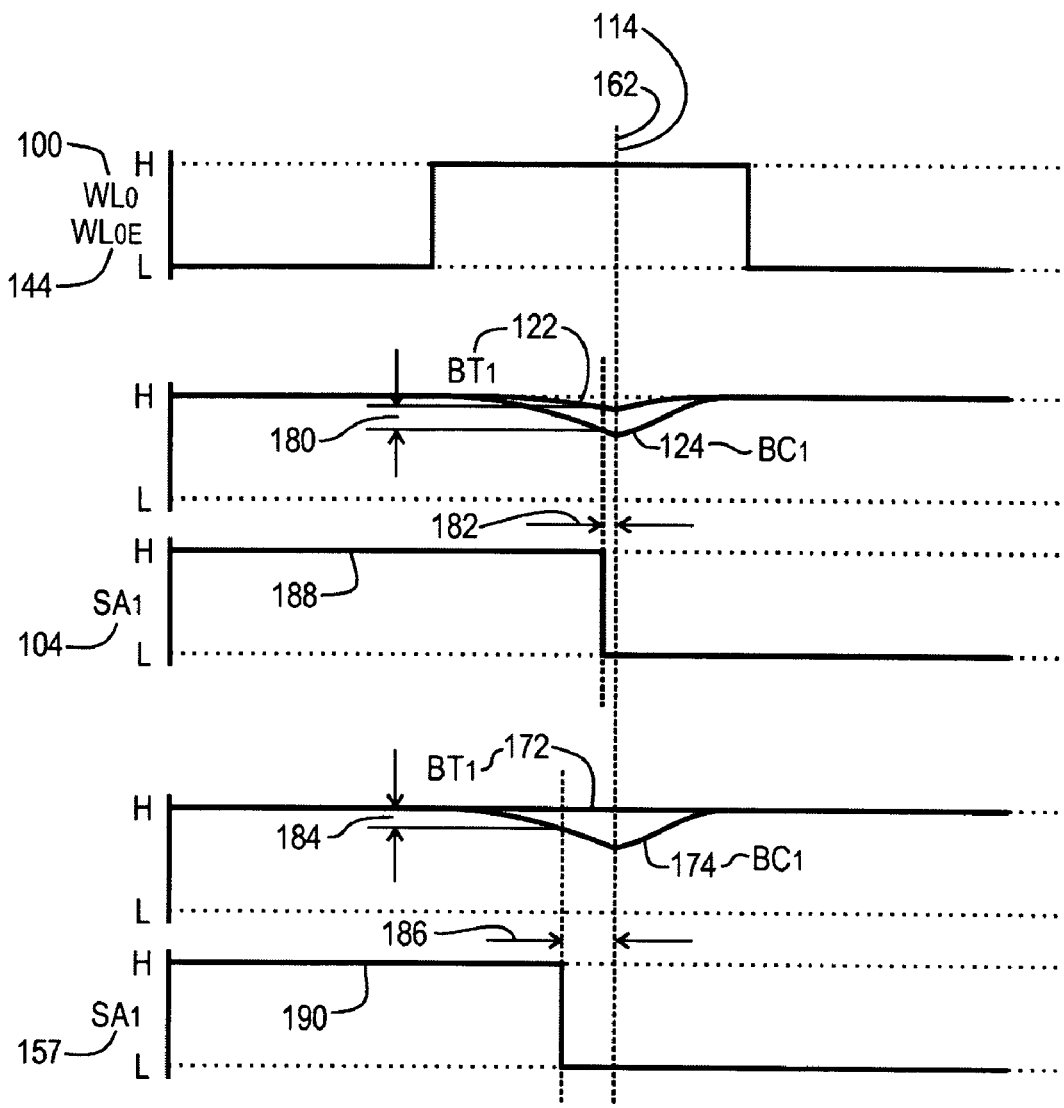
FIG. 10 is a signal-timing diagram exemplifying the performance of an illustrative embodiment of the present invention.

The reduced effects of noise and improved performance of the present invention can be better appreciated with reference to FIG. 10, which is a signal-timing diagram clarifying the performance of the illustrative embodiment of the present invention as compared to the prior art. In FIG. 10, the word line assertion signals for both of the prior art word line 100 and the illustrative embodiment even word line 144 are superimposed on one another. So too are the sense amplifier read and pre-charge activation times 114 and 162. These diagrams generally superimpose the prior art and present invention signals from FIG. 7 and FIG. 9. The prior art bit-true line 122 and bit compliment lines 124 are shown, together with sense amplifier 104 output signal 188. Note that the sense amplifier signal 188 goes active prior to the sense amplifier read time 114 by a margin in time shown as distance 182. The occurrence of the sense amplifier output 105 going active occurs when there is sufficient margin between the bit-true line signal 122 and bit-compliment line signal 124. This margin is indicated by the differential voltage 180. That differential voltage 180 is delayed in time due to the aforementioned coupled noise present on bit-true line 122. The noise improvement in the illustrative embodiment of present invention is made clear by the superimposed bit-true line 172 and bit-compliment line 174. Note that the minimum differential voltage 184 occurs earlier in time because of the lack of coupled noise in bit-true line 172. The earlier occurrence results in a wider margin of time 186 between when the sense amplifier 156 output 157 signal 190 is stable and when the sense amplifier read time 162 us reached.

As a practical matter, the improved noise benefit of the present invention means there is a higher yield of chips in any given wafer of memory cells produced, or the memory system designers may be able to specify a higher clock rate for the devices, even considering the operational differences over time and supply voltage variations. Respecting power requirement improvements of the present invention, actual power reduction improvements have been simulated and determined to be 34% for a 2048×16 bit memory.

The reduced power benefit of the present invention can be appreciated with reference to FIG. 11 and FIG. 12. FIG. 11 is a timing diagram of all the bit lines affected in a single word line row assertion in an 8-bit by 8-bit memory array according to the prior art. FIG. 12 is a timing diagram of all the bit lines in a single word line assertion in an 8-bit by 8-bit memory according to an illustrative embodiment of the present invention. In the examples of FIG. 11 and FIG. 12, all of the bit cells have a logical HIGH value stored therein. As such, all of the bit-true bit lines will produce a logical HIGH when read. Conversely, all the bit-compliment bit lines will produce a logical LOW when read. In the case of the prior art memory of FIG. 11, the word line assertion results in each of the columns 200, 202, 204, 206, 208, 210, 212, and 214 producing a continuous logical HIGH value at the corresponding bit-true bit lines. Thus, none of the bit-true bit lines result in a current loading of the circuit, as discussed herein before. On the other hand, since the asserted word line is coupled to all of the bit cells in the prior art, all of the corresponding bit-compliment bit lines are driven toward a logical LOW state. This is readily apparent with reference to the waveforms for each of the bit-compliment bit lines, 200, 202, 204, 206, 208, 210, 212, and 214, which drive toward a low voltage during the word line assert cycle. This results in a current and power consumption equaling approximately eight times that of driving a single bit line.

In the case of the illustrative embodiment in FIG. 12, the asserted word line is coupled to the bit cells in the odd columns only. Thus, the word line assertion does not couple the even bit cells in columns 220, 224, 228, and 232. None of these bit-true and bit-compliment bit lines are driven, and thus consume no current or power. Only the odd bit cells 222, 226, 230, and 234 are coupled. Accordingly only these bit-compliment bit lines are driven, and thus the current and power consumed equals approximately four times that of driving a single bit line. As compared to the prior art memory of FIG. 11, the power consumed is greatly reduced.

In FIG. 12, a small memory array is discussed where each word line is coupled to every-other bit cell in a given row. As noted herein before, the present invention contemplates that each word line may be coupled to any reasonable fraction of the bit cells in a given row. The fractions of one-half, one-quarter, and one-eight have been specifically discussed, but any other fractions, whether equally distributed between the plural word lines or not, can be used. The distribution of the bit cells coupled to any given word line does not have to alternate within the row, or even be equally distributed along the row. The relationship and placement of the coupled bit cells can be determined according to the memory designer's particular constraints. For example, all of the bit cells on one end of a row could be coupled to a first word line, and the remaining bit cells on that row coupled to another one, or more, word lines. Any pattern of bit cells interconnection to the plural word lines may be used, without limitation.

Figure 13:
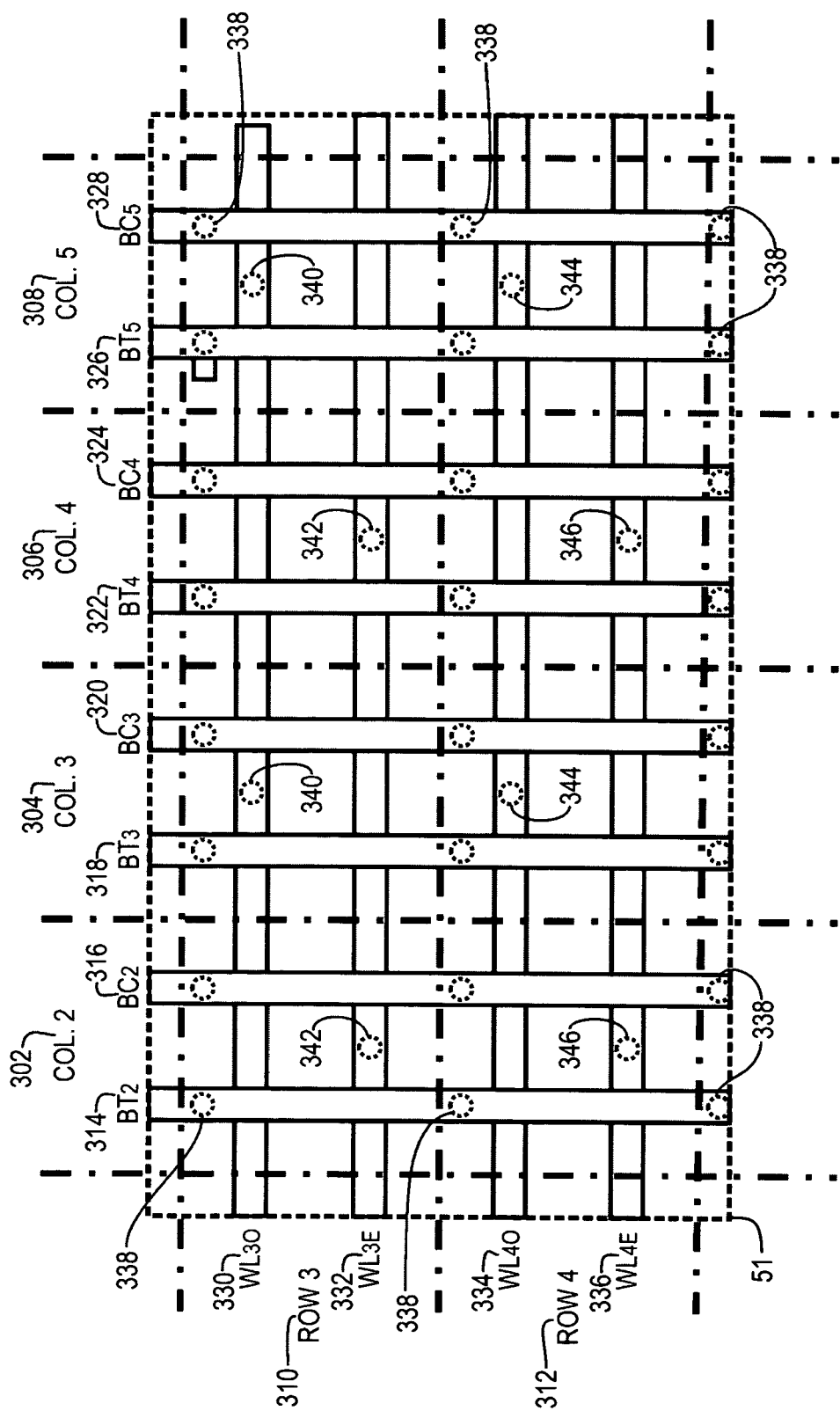
FIG. 13 is a top view drawing of a portion of a memory array according to an illustrative embodiment of the present invention.

Reference is directed to FIG. 13, which is a top view drawing of a portion 51 of a memory array according to an illustrative embodiment of the present invention. The portion 51 illustrated corresponds to portion 51 outlined in FIG. 4. FIG. 13 illustrates the physical structure of a static RAM memory array, which corresponds to the aforementioned schematic and timing diagram illustrations. FIG. 13 particularly illustrates the word line and bit line metal layers, which are physically routed on upper layers above the bit cell circuitry (not shown). The portion 51 illustrated consists of column '2' 302, column '3' 304, column '4' 306 and column '5' 308 where they intersect row '3' 310 and row '4' 312 in the memory array. The memory bit cells are fabricated on a silicon die at the intersection of each column and row (not shown). Further details of the bit cell structure will be described with respect to FIG. 14. In FIG. 13, the plural word lines and bit lines are shown. In particular, every bit cell in column '2' 302 is coupled through plural 'vias' 338 to bit-true bit-line 314 and bit-compliment bit-line 316. In column '3' 304 every bit cell is coupled by plural vias 338 to bit-true bit-line 318 and bit-compliment bit-line 320. In column '4' 306 every bit cell is coupled by plural vias 338 to bit-true bit-line 322 and bit-compliment bit-line 324. In column '5' 308 every bit cell is coupled by plural vias 338 to bit-true bit-line 326 and bit-compliment bit-line 328. The rows of bit cells in portion 51 are alternately coupled to pairs of word lines the transverse the array corresponding to the fraction of bit cells that lie along each row, and according to the illustrative embodiment of the present invention.

The bit cells in the odd numbered columns 304, 308 fraction are coupled to the odd word line 330 in row '3' 310 at vias 340. The bit cells in the even numbered columns 302, 306 fraction are coupled to the even word line 332 in row '3' 310 at vias 342. Similarly, bit cells in the odd numbered columns 304, 308 fraction are coupled to the odd word line 334 in row '4' 312 at vias 344. And, bit cells in the even numbered columns 302, 306 fraction are coupled to the even word line 336 in row '4' 312 at vias 344. This arrangement deploys the alternating fraction column arrangement of the illustrative embodiment, insuring that no two bit cells within each fraction are positioned adjacent to one another, so that no two adjacent bit lines are simultaneously coupled to bit cells during any given word line activation, thereby causing the non-coupled bit lines to act as neutral conductive elements between activated and accessed bit lines.

Reference is directed to FIG. 14, which is a section view drawing through that portion 51 of the static RAM memory array corresponding to FIG. 4 and FIG. 13, and according to an illustrative embodiment of the present invention. The section view illustrates the built-up layers of the semiconductor device, particularly showing column '2' 302, column '3' 304, column '4' 306 and column '5' 308, with corresponding bit-true and bit compliment bit lines 314, 316, 318, 320, 322, 324, 326, 328, etc. The general structure and fabrication design of memory arrays are understood by those skilled in the art. The bit lines are fabricated in the 'Metal 3' layer 346 of the device. The 'Metal 3' layer rests on an oxide insulating layer 348. Below that is the 'Metal 2' layer 350, which comprises the aforementioned word lines 330, 332, 334, and 336. The 'Metal 2' layer 350 is insulated by oxide layer 352. The 'Metal 1' layer is used to interconnect the bit lines and word lines to the active devices in the bit cells, as well as for other circuit interconnection purposes. Note that the 'Metal 2' 350 and 'Metal 3' 246 layers may also be used to route other circuit traces, including power supply, grounding, and other circuit functions.

The 'Metal 1' layer 354 is insulated above the 'poly' layer 358 by oxide layer 356. The poly layer 358, in combination with the thin oxide layer 360 and the dopant diffusions 362 in the silicon substrate 364 form the active components, principally metal oxide field effect transistors, in the device. The active components are connected together at the 'poly' layer 358 and the 'Metal 1' layer to create the bit cells, pass gates, and other memory array components discussed hereinbefore.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A static random access memory with reduced parasitic capacitive coupling for improved noise performance, comprising:

an array of plural static memory bit cells, having a bit-latch coupled between a bit-true pass-gate and a bit-compliment pass-gate, organized as plural columns and plural rows;

plural bit lines pairs aligned with said plural columns, each of said bit line pairs including a bit-true and a bit-compliment bit line aligned in parallel, and wherein said plural bit cell pass-gates are electrically coupled to each of a bit-true and a bit-compliment pair of said plural bit lines within all of that portion of said plural static memory bit cells that lie along the corresponding one of said plural columns, and plural word lines aligned with each of said plural rows, each of said rows having an integer multiple number, greater than one, of word lines aligned therewith, each one of said integer multiple number of word lines electrically coupled to an alternating fraction, equal to the inverse of said integer multiple, of all of that portion of said plural bit cells that lie along the corresponding one of said plural rows, and wherein said plural bit-true and bit-compliment pass gates do not couple their respective bit cell memory states until activated by one of said plural word lines, and wherein no two bit cells within each of said fractions of said plural bit cells are positioned adjacent to one another within said array, such that the conductive traces in the memory that form said plural bit lines pairs alternate position corresponding to said alternating coupling of said word line fractions, thereby ensuring that no two adjacent bits lines are simultaneously coupled to bit cells during any given word line activation, and thereby causing said non-coupled bit lines to act as a neutral conductive elements between activated and accessed bit lines.

2. The memory of claim 1 wherein the number of said plural word lines aligned with each of said plural rows is an integer number that is greater than one.

3. The memory of claim 2 wherein said integer number is a power of two.

4. The memory of claim 2 wherein said fraction is the inverse of said integer number.

5. The memory of claim 2, further comprising a row decoder coupled to said plural word lines and operable to selectively activate an individual one of said plural word lines aligned with each particular row based on the address of a bit cells presently decoded for access.

6. The memory of claim 5 wherein said individual one of said word lines is activated for reading data from or writing data to presently decoded bit cells.

7. A method of reducing parasitic capacitive coupling during access of a static random access memory having an array of bit cells organized as plural columns and plural rows, each column of bit cells being electrically coupled to a bit-true and a bit-compliment bit line aligned in parallel therewith, and having plural word lines, with an integer number greater than one of the plural word lines aligned with each of the plural rows, and each of the plural word lines being electrically coupled to an alternating fraction of the plural bit cells that lie along the row of bit cells aligned therewith, the faction being equal to the inverse of the integer number, wherein the plural bit cells do not couple their respective memory states to any of the plural bit lines until activated by one of the plural word lines, and wherein no two bit cells within each of the fractions of plural bit cells are positioned adjacent to one another, such that the conductive traces in the memory that form the plural bit lines alternate position corresponding to the alternating coupling of the word line fractions, thereby ensuring that no two adjacent bit lines are simultaneously coupled to adjacent bit cells during any given word line activation, thereby causing the non-coupled bit lines to act as neutral conductive elements between activated and accessed bit lines, the method comprising the steps of:

asserting a first word line, thereby enabling the fraction of the bit cells along the row aligned therewith, and accessing at least a first one of said enabled bit cells through the corresponding electrically coupled bit line.

8. The method of claim 7 wherein said integer number is a power of two.

9. The method of claim 7 further comprising the step of writing data to said at least a first one of said enabled bit cells.

10. The method of claim 7 further comprising the step of reading data from said at least a first one of said enabled bit cells.

11. The method of claim 7 wherein each of the bit cells include a bit-latch and at least a first pass gate, and wherein said asserting step further comprises the step of:

enabling the pass gates of the fraction of bit cells along the row aligned therewith.

\* \* \* \* \*